(12) United States Patent
Kurihara et al.

(10) Patent No.: US 7,153,613 B2
(45) Date of Patent: Dec. 26, 2006

(54) PROCESS FOR THE FABRICATION OF A PHASE MASK FOR OPTICAL FIBER PROCESSING, OPTICAL FIBER-PROCESSING PHASE MASK, OPTICAL FIBER WITH A BRAGG GRATING, AND DISPERSION COMPENSATING DEVICE USING THE OPTICAL FIBER

(75) Inventors: Masaaki Kurihara, Tokyo (JP);
Shigekazu Fujimoto, Tokyo (JP);
Tetsuro Komukai, Tokyo (JP); Tetsuro Inui, Tokyo (JP)

(73) Assignees: Dai Nippon Printing Co., Ltd., Toyko (JP); Nippon Telegraph and Telephone Corporation, Tokyo (JP)

( * ) Notice: Subject to any disclaimer, the term of this patent is extended or adjusted under 35 U.S.C. 154(b) by 441 days.

(21) Appl. No.: 10/234,452

(22) Filed: Sep. 3, 2002

(65) Prior Publication Data

US 2003/0077039 A1 Apr. 24, 2003

(30) Foreign Application Priority Data

Sep. 3, 2001 (JP) ............................. 2001-265230

(51) Int. Cl.
*G01F 9/00* (2006.01)
(52) U.S. Cl. ............................................. 430/5
(58) Field of Classification Search ............... 430/5, 430/30, 296; 385/37, 89, 91
See application file for complete search history.

(56) References Cited

U.S. PATENT DOCUMENTS

| 6,072,926 A * | 6/2000 | Cole et al. ................... 385/37 |
| 2002/0028390 A1 * | 3/2002 | Mazed ........................... 430/5 |
| 2003/0006212 A1 * | 1/2003 | Segawa et al. .............. 216/12 |

FOREIGN PATENT DOCUMENTS

| EP | 0602829 | 6/1994 |
| EP | 0606726 | 7/1994 |
| EP | 0936505 | 8/1999 |
| JP | 11-72631 | 3/1999 |
| WO | WO163325 | 8/2001 |

OTHER PUBLICATIONS

Patent Abstracts of Japan Vo. 1999, No. 8, Jun. 30, 1999 & JP 11 072631 & EP 0940 695.
Patent Abstracts of Japan vol. 1997, No. 7, Jul. 31, 1997 & JP 09 080738.
Tennant D M: "Characterizationof Near-field holography grating masks for optoelectronicsfabricated by electron beam lithography", Journal of Vacuum Science & Technology: Part B, American Instutite of Physis, New Yor, US, vol. 10, No. 6, Nov. 1, 1992, pp. 2530-2535.

* cited by examiner

*Primary Examiner*—S. Rosasco
(74) *Attorney, Agent, or Firm*—Patenttm.us; James H. Walters

(57) ABSTRACT

The invention relates to a process for the fabrication of an optical fiber-processing phase mask that is reduced in terms of pitch variations on the mask and stitching errors, and provides a process for the fabrication of a chirped type optical fiber-processing phase mask wherein a grating form of grooves provided in one surface of a quartz substrate is configured as an optical fiber-processing grating pattern. At an exposure step, writing data obtained by arranging and compiling a plurality of data for a repetitive groove-and-strip pattern while the pitch of repetition is modulated are used and an electron beam resist is provided on a phase mask blank, so that writing is carried out all over the writing area on said phase mask blank continuously in a vertical direction to said grating form of grooves.

18 Claims, 6 Drawing Sheets

PROCESS FOR THE FABRICATION OF A PHASE MASK FOR OPTICAL FIBER PROCESSING, OPTICAL FIBER-PROCESSING PHASE MASK, OPTICAL FIBER WITH A BRAGG GRATING, AND DISPERSION COMPENSATING DEVICE USING THE OPTICAL FIBER

BACKGROUND OF THE INVENTION

The present invention relates to a process for the fabrication of a phase mask for using ultraviolet laser light to make diffraction gratings in optical fibers used for optical communications, etc., a phase mask, an optical fiber with a Bragg grating, and a dispersion compensating device.

In optical fiber communication systems, enormous amounts of information must be transmitted at very high speeds. An optical fiber system comprises an optical signal source for conveying information, an optical fiber transmission line and a receiver for demodulating information that light signals convey.

For optical communication systems, optical fibers made of high-purity silica are generally used as transmission media. Typically, a conventional optical communication system is designed to transmit light signals using a certain wavelength range. In that system, a component of longer wavelength is subjected to a longer delay in propagation time than that of shorter wavelength. So far, however, this dispersion has not caused considerable deterioration of light signal information. This is because a single channel selected from a wavelength region with reduced dispersion has been used in early-stage systems.

As encountered in wavelength division multiplexing (WDM) systems representative of high-speed transmission technologies using optical fibers, a number of channels must now be used over a wider wavelength region so as to convey a great amount of information. With this, it is required to make more precise compensation for group velocity dispersion. For instance, when it comes down to a WDM system, compensation for dispersion in association with an increased number of channels provided therein becomes an increasingly important challenge.

Recently, for a Bragg diffraction grating formed in an optical fiber there has been demanded a chirped grating in which the grating pitch increases or decreases linearly or nonlinearly depending on the position of the direction of right-angle intersection (or repetition) of grating. Such gratings, for instance, are used as high-reflecting mirrors with a widened reflecting zone, delay time control means, etc.

To address the increasing demands for such chirped gratings, the inventor has come up with a process for the fabrication of an optical fiber-processing phase mask by providing a grating form of repetitive groove-and-strip pattern which is provided on one surface of a transparent substrate, and irradiating an optical fiber with light diffracted by the repetitive groove-and-strip pattern to make a diffraction grating in the optical fiber by interference fringes obtained by interference of diffracted light of different orders of diffraction, wherein a plurality of patterns comprising grooves and strips at varying pitches are written in a row, thereby making said grating form of repetitive groove-and-strip pattern (see JP-A 11-72631).

With a grating prepared using the phase mask fabricated by this process, however, there is a problem that noises are produced in reflection spectra by reason of stitching errors in a writing device used for mask fabrication, and with a grating for dispersion compensation, a problem is that ripples in group delay characteristics, crosstalks, etc. take place, producing an adverse influence on device performance.

SUMMARY OF THE INVENTION

In view of such a challenge of achieving dispersion compensation demanded so far in the prior art as well as problems with the prior art, the primary object of the invention is to provide a process for the fabrication of an optical fiber-processing phase mask reduced in terms of on-mask pitch variations and stitching errors and an optical fiber-processing phase mask reduced in terms of on-mask pitch variations and stitching errors.

The second object of the invention is to provide an optical fiber with a Bragg grating, which is reduced in terms of noises occurring by reason of stitching errors in a writing device upon mask fabrication and group delay ripples.

The third object of the invention is to provide a dispersion compensating device that has reduced group delay ripples.

According to the first aspect of the invention, the primary object of the invention is achieved by the provision of a process for the fabrication of a chirped type optical fiber-processing phase mask wherein a grating form of grooves provided in one surface of a quartz substrate is configured as an optical fiber-processing grating pattern, characterized in that:

at an exposure step, writing data obtained by arranging and compiling a plurality of data for a repetitive groove-and-strip pattern while the pitch of repetition is modulated are used and an electron beam resist is provided on a phase mask blank, so that writing is carried out all over the writing area on said phase mask blank continuously in the direction vertical to the grating form of grooves.

Unlike the process set forth in JP-A 11-72631 wherein data having a constant width ratio between grooves and strips and a linearly or nonlinearly increasing or decreasing pitch are simply arranged in a stepwise manner, the process for the fabrication of an optical fiber-processing phase mask of the invention is characterized in that a plurality of data for a repetitive groove-and-strip pattern are arranged while the pitch of repetition is modulated, and compiled by computer processing or the like for removal of any partition between the data. This enables stitching errors on writing to be reduced and so improves the group delay characteristics of a replicated Bragg grating.

By carrying out multiple exposure in the process for the fabrication of an optical fiber-processing phase mask according to the invention, group delay ripples can be much more reduced.

The multiple exposure may be carried out by multiple writing at the same place or at an arbitrarily displaced writing area.

In the process for the fabrication of an optical fiber-processing phase mask according to the invention, writing may be carried out by means of an electron beam or laser light lithography device.

The grating form of repetitive groove-and-strip pattern may have a pitch in the range between 0.85 μm to 1.25 μm.

It is desired that the difference between the grooves and strips in the grating form of repetitive groove-and-strip pattern be of such magnitude that the phase of optical fiber-processing ultraviolet light is shifted by approximately π upon transmission.

The invention in another aspect is to provide a solution to problems with the aforesaid optical fiber-processing mask. As set forth in this aspect, there is provided a chirped type optical fiber-processing phase mask wherein a grating form of grooves provided in one surface of a quartz substrate is configured as an optical fiber-processing grating pattern, characterized in that:

said phase mask is obtained by a fabrication process wherein at an exposure step, writing data obtained by arranging and compiling a plurality of data for a repetitive groove-and-strip pattern while the pitch of repetition is modulated are used and an electron beam resist is provided on a phase mask blank, so that writing is carried out all over the writing area on said phase mask blank continuously in the direction vertical to the grating form of grooves.

In the optical fiber-processing phase mask of the invention, the grating form of repetitive groove-and-strip pattern may be formed by multiple exposure. By carrying out multiple exposure, group delay ripples can be much more reduced.

The multiple exposure may be carried out by multiple writing at the same place or at an arbitrarily displaced writing area.

The optical fiber-processing phase mask of the invention may be formed by writing using an electron beam or laser light lithography device.

In the optical fiber-processing phase mask of the invention, the grating form of repetitive groove-and-strip pattern may have a pitch in the range between 0.85 µm to 1.25 µm.

In the optical fiber-processing phase mask of the invention, the difference between the grooves and strips in the grating form of repetitive groove-and-strip pattern may be of such magnitude that the phase of optical fiber-processing ultraviolet light is shifted by approximately $\pi$ upon transmission.

An optical fiber with a Bragg grating according to the second object of the invention may be provided by processing an optical fiber using a phase mask fabricated by the inventive fabrication process set forth in the first aspect described hereinabove.

This optical fiber with a Bragg grating has group delay ripple characteristics of preferably ±10 ps or lower, and more preferably ±3 ps or lower.

A dispersion compensating device according to the third object of the invention may be provided by processing using a phase mask fabricated by the fabrication process set forth in the first aspect described hereinabove.

Still other objects and advantages of the invention will be apparent.

The invention accordingly comprises the features of construction, combinations of elements, and arrangement of parts, which will be exemplified in the construction hereinafter set forth, and the scope of the invention will be indicated in the claims.

BRIEF DESCRIPTION OF THE DRAWINGS

FIG. 1(a) is illustrative of a data state before data compiling, and FIG. 1(b) is illustrative of a data state after data compiling.

DESCRIPTION OF THE PREFERRED EMBODIMENTS

Embodiments of the process for the fabrication of an optical fiber-processing mask of the invention are explained in detail.

Figure 1A:
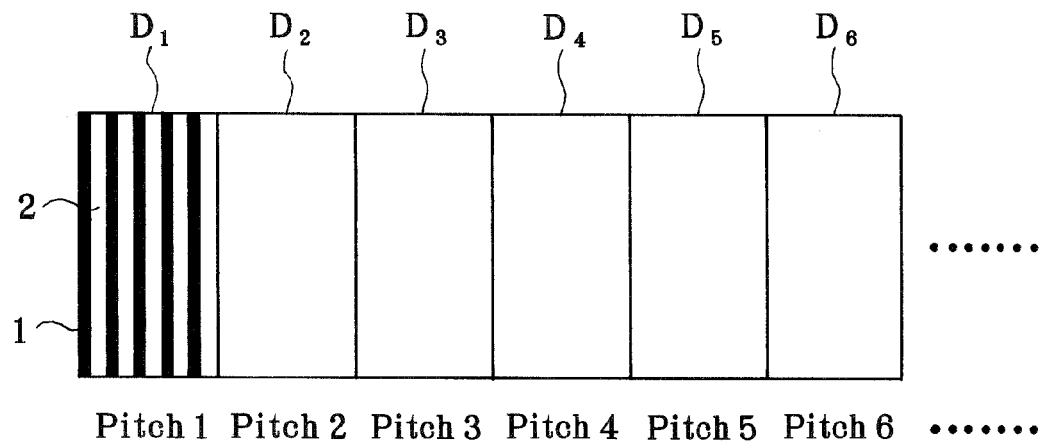
FIGS. 1(a) and 1(b) are illustrative of data compiling according to the invention.

As shown in FIG. 1(a), a plurality of patterns $D_1$, $D_2$, $D_3$, $D_4$, $D_5$, $D_6$, ..., which each comprise a plurality of lines 1 and a plurality of spaces 2 and have varying line-to-line pitches such as pitch 1, pitch 2, pitch 3, ..., are arranged in sequence. To be more specific, each pattern data is prepared by scaling down basic pattern data defined by one pitch of writing data comprising a 0.125 µm address unit and 10 scanning lines down to a scale of (desired grating pitch/(0.125×10).

Figure 1B:
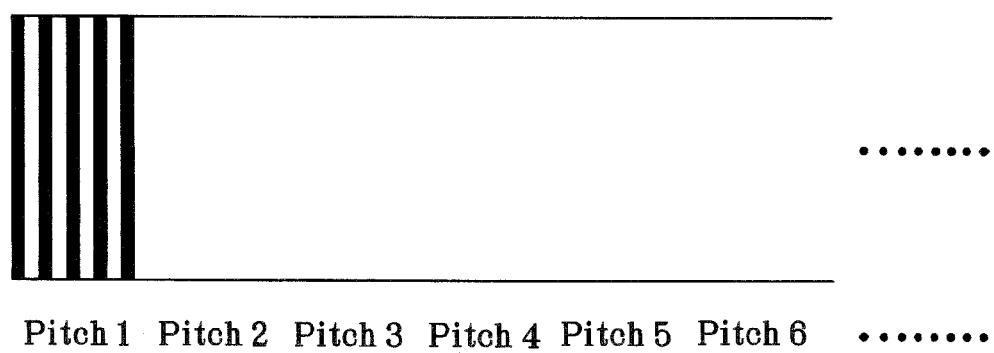

Then, a plurality of pattern data arranged as mentioned above is so compiled that there can be created a partition between the data, as shown in FIG. 1(b).

By the phrase "compiling" used herein it is intended that the data are compiled in such a way that the pattern can be written in the scanning direction at a writing stage on one bus.

Figure 2:
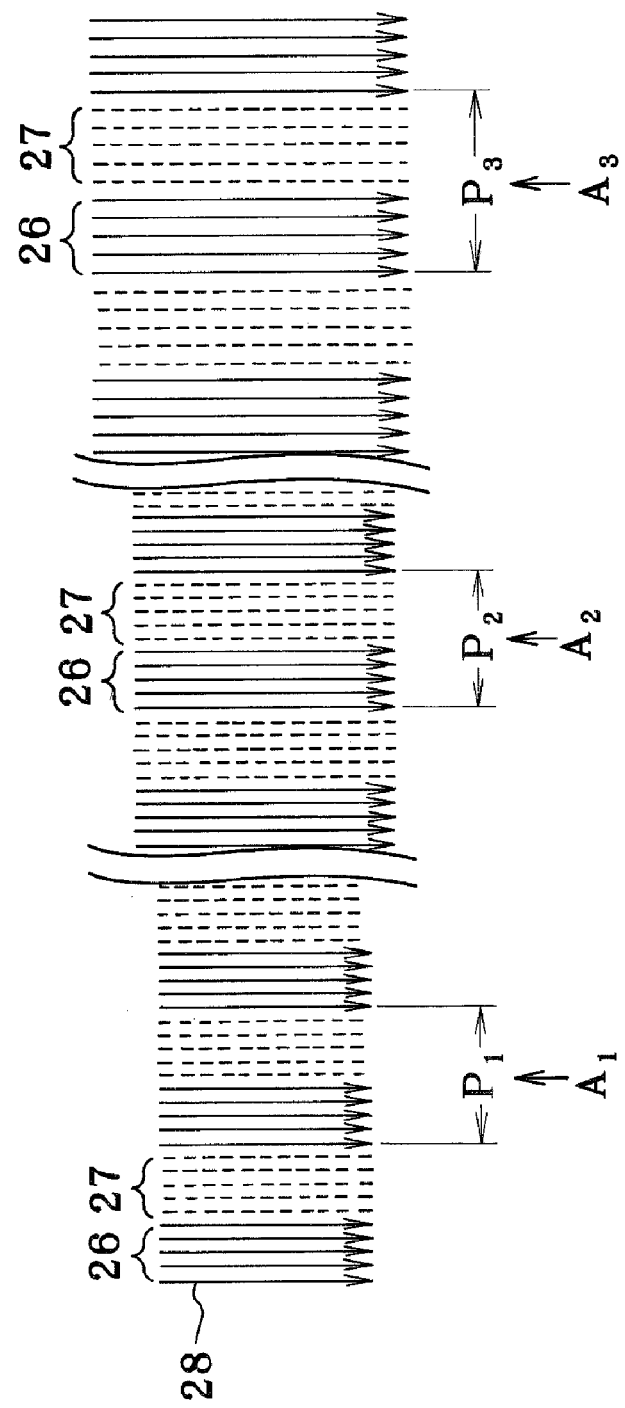
FIG. 2 is illustrative of a writing process used in the fabrication process used in the invention.

How to write the pattern with the thus compiled writing data is now explained. FIG. 2 is a top view illustrative of how to write the pattern with the compiled writing data. A left-end area $A_1$ sampled out of a phase mask 21 has a groove 26 or a strip 27 at a pitch $p_1$, a similarly sampled central area $A_2$ has a groove 26 or a strip 27 at a pitch $P_2$, and a similarly sampled right-end area $A_3$ has a groove 26 or a strip 27 at a pitch $P_3$, provided that $P_1<P_2<P_3$. While scanning lines 28 are written by electron beams from top to bottom, grooves 26 are written from the left to the right end by means of raster scan. At the area $A_1$, too, multiple scanning lines (five in FIG. 2) are used to write one groove 26. Then, at the position where the strip 27 is to be written, multiple scanning lines are blanked out. For this reason, the distance between the centers of scanning lines 28 varies at the areas $A.\text{sub.}_1$, $A.\text{sub.}_2$ and $A.\text{sub.}_3$ depending on the pitches $P_1$, $P_2$ and $P_3$.

As explained above, the pitch of the groove 26 or strip 27 on the phase mask 21 is linearly or nonlinearly increased or decreased depending on a position at right angles with the groove 26, so that the width of the groove 26 or the strip 27 can be increased or decreased following the resulting variation. It is then preferable to make use of a writing process wherein the number of raster scans for writing one groove 26 is kept constant at any position. This is because for writing the whole pattern of the phase mask 21 by electron beams, it is only needed to provide the writing data defined by one pitch of basic pattern data for the mask 21 and a reduced scale function for the basic pattern data, which corresponds to a pitch variation function depending on the position at right angles with the groove 26.

One specific process for etching a mask blank on the basis of the compiled writing data formed as explained above, thereby fabricating a phase mask is explained with reference to FIGS. 3(a) through 3(h), wherein 10 stand for a phase mask blank, 11 a quartz substrate, 12 an opening in a chromium thin film, 13 an electron beam resist, 13A a resist pattern, 13B an opening in the resist, 14 an electron beam, 21 a phase mask, 26 a groove and 27 a strip.

Figure 3A:
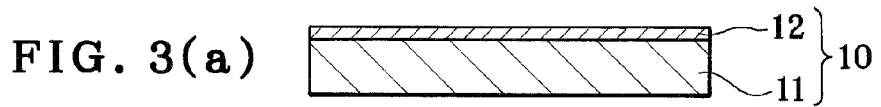
FIGS. 3(a) through 3(h) are sectional views of steps of one embodiment of the phase mask fabrication process of the invention.

First of all, as shown in FIG. 3(a), there is provided a mask blank 10 comprising a quartz substrate 11 and a 150 Å-thick chromium thin film 12 formed by sputtering thereon. The chromium thin film 12 is helpful to prevent charging-up of an electron beam resist 13 upon irradiation with electron beams at the post-step, and serves as a mask upon grooves 26 formed in a quartz substrate 11. It is here noted that control of the thickness of the chromium thin film is of importance in view of resolution on chromium thin film etching, and so that thickness should be appropriately in the range of 100 to 200 Å.

Figure 3B:
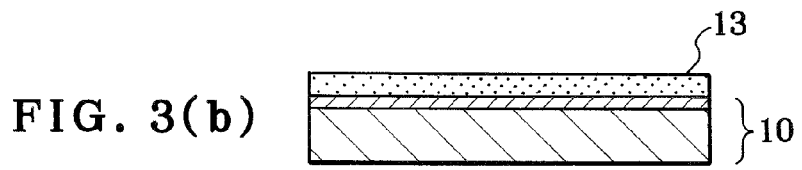

Then, as shown in FIG. 3(b), RE5100P (Hitachi Chemical Industries Co., Ltd.) is coated as an electron beam resist 13 at a thickness of 400 nm, followed by drying.

Figure 3C:
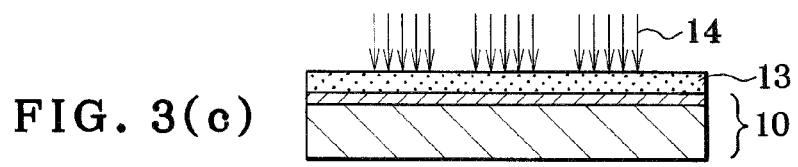

Thereafter, as shown in FIG. 3(c), the electron beam resist 13 is exposed to light at an exposure of 1.2 $\mu C/cm^2$ using a raster scan type electron beam lithography device MEBES111 (made by ETEC Co., Ltd.) while the width of electron beams 14 between scanning lines is sequentially controlled on the basis of the compiled exposure data as already explained with reference to FIG. 2.

Figure 3D:
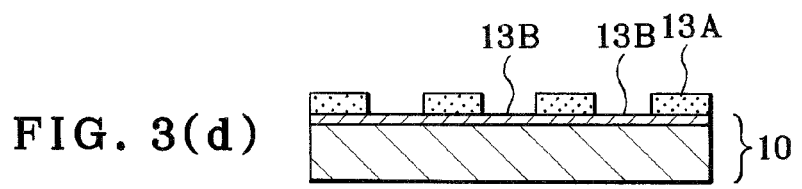

After that exposure, PEB (post exposure baking) is carried out for 5 minutes at 50° C., following which the electron beam resist is developed in TMAH (tetramethyl-ammonium hydroxide) at a 2.38% concentration to form the desired resist pattern 13(A) as shown in FIG. 3(d). Note that PEB is carried out to selectively enhance the sensitivity of the portion of the electron beam resist 13 irradiated with electron beams 14.

Figure 3E:
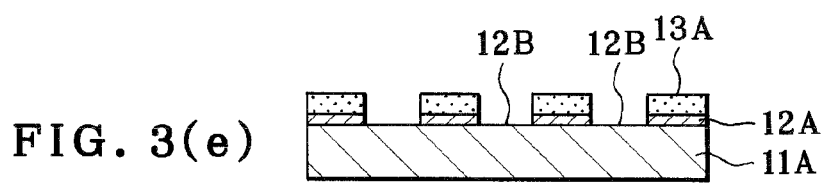

Then, dry etching is carried out using $CH_2Cl_2$ gas while the resist pattern 13A is used as a mask, thereby forming such a chromium thin film pattern 12A as shown in FIG. 3(e).

Figure 3F:
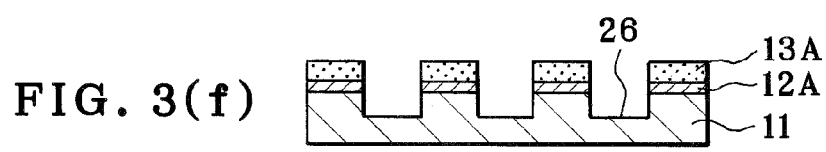

Then, while the chromic acid pattern 12A is used as a mask, etching of just 240 nm in depth is carried out using $CF_4$ gas, as shown in FIG. 3(f). Depth control is effected by control of etching time, so that etching is feasible with the depth range of 200 to 400 nm. For control of the selected depth D of the groove 26 in the phase mask 21 (a difference in height between the strip 27 and the groove 26), the etching conditions are determined in such a way that the phase of excimer laser 23 that is exposure light is modulated by $\pi$ radian.

Figure 3G:
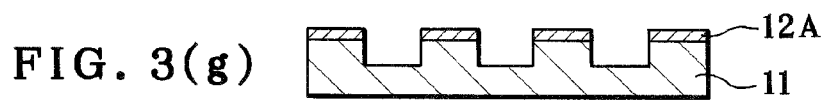
Figure 3H:
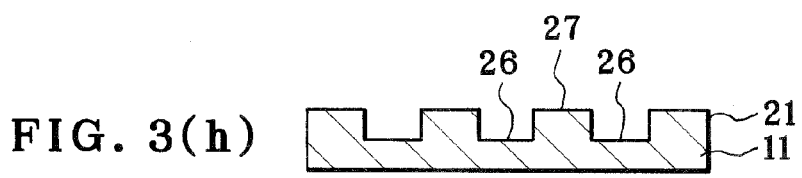

Then, as shown in FIG. 3(g), the resist pattern 13A is stripped with sulfuric acid at 70° C., after which, as shown in FIG. 3(h), the chromium thin film pattern 12A is etched out in an ammonium solution of ceric nitrate. Finally, rinsing is carried out to complete a line (strip 27)-to-space (groove 26) phase mask 21 which has a depth of 240 nm and a pitch changing linearly from 0.85 μm to 1.25 μm in the direction at right angles with the groove 26.

In the phase mask obtained as mentioned above, there is no stitching error due to writing. A grating replicated using this phase mask is found to have improved group delay characteristics.

Figure 6A:
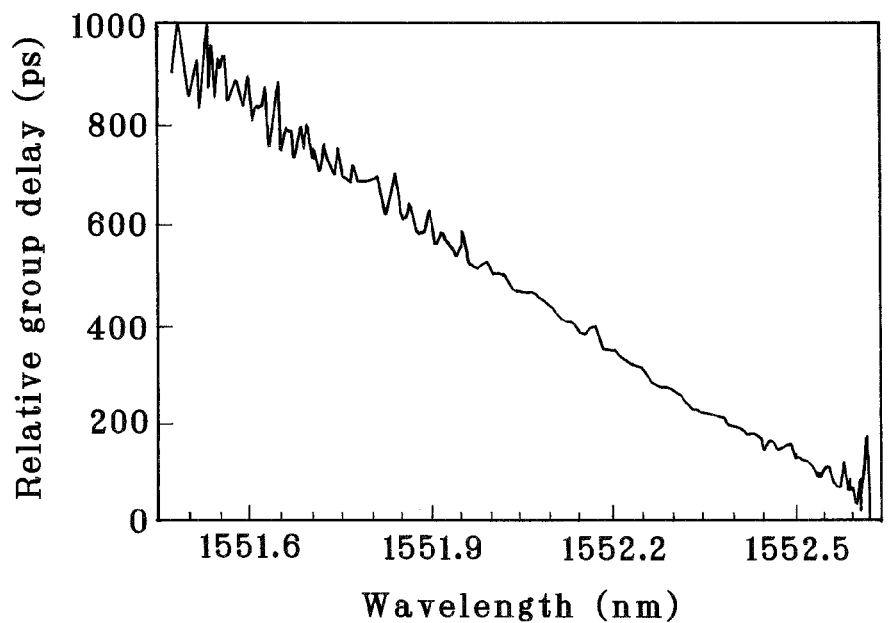
FIG. 6(a) is a diagram showing a wavelength vs. relative group delay relationship for a phase mask on an electron beam writing device.
Figure 6B:
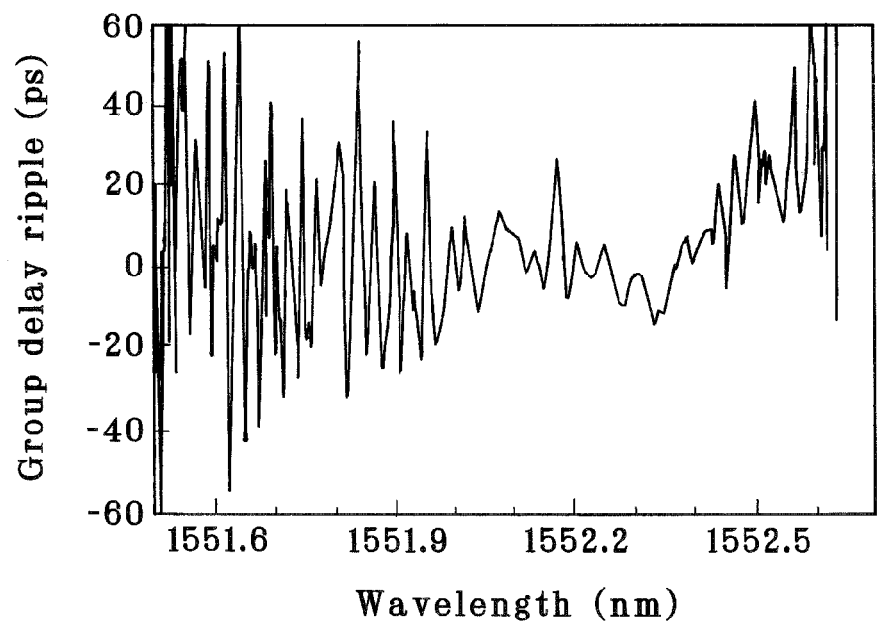
FIG. 6(b) is a diagram showing a wavelength vs. group delay ripple relationship of a phase mask on a laser writing device.
Figure 7A:
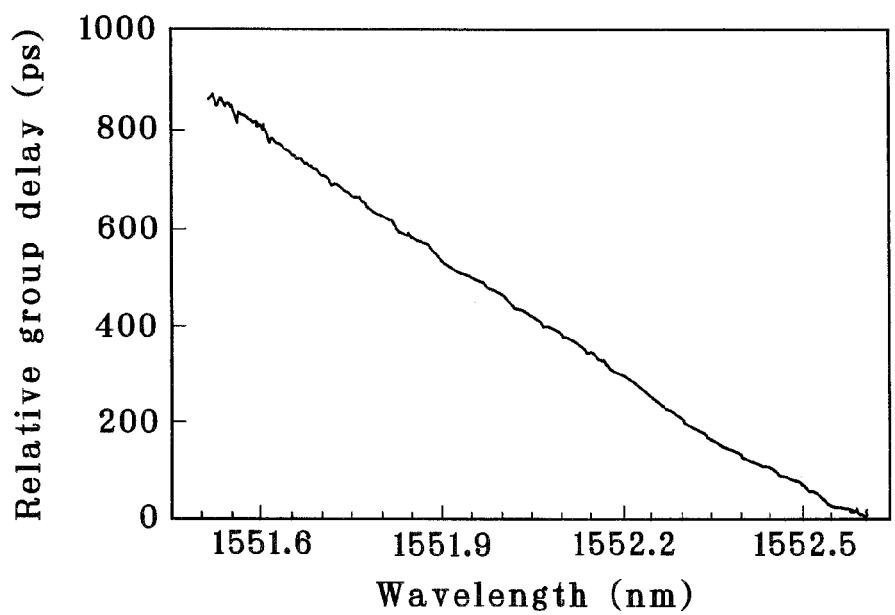
FIG. 7(a) is a diagram showing a wavelength vs. relative group delay relationship for a phase mask on an electron beam writing device.
Figure 7B:
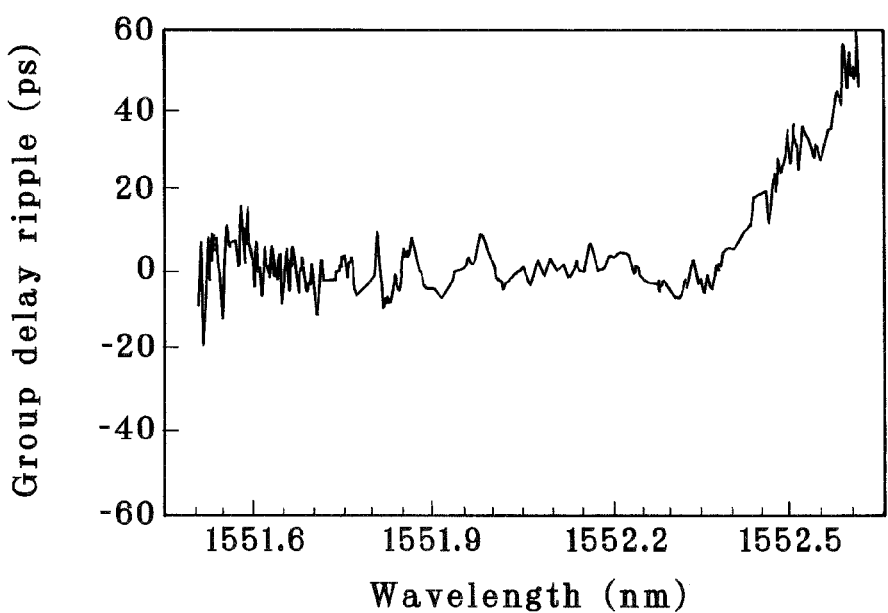
FIG. 7(b) is a diagram showing a wavelength vs. group delay ripple relationship of a phase mask on a laser writing device.

FIGS. 6(a) and 6(b) show the group delay and group delay ripple of a phase mask fabricated by a conventional process using an electron beam lithography system. Specifically, FIG. 6(a) is a frequency vs. relative group delay graph and FIG. 6(b) is a frequency vs. group delay ripple graph. FIGS. 7(a) and 7(b) show the group delay and group delay ripple of a phase mask fabricated by the writing process of the invention. Specifically, FIG. 7(a) is a frequency vs. relative group delay graph and FIG. 7(b) is a frequency vs. group delay ripple graph. Especially in the case of a laser writing mask, there is a reduced delay ripple having a value smaller than that in the prior art.

The present invention is not limited to the writing process for arranging pattern data in a row as shown in FIG. 2; that is, it may also be applied to writing processes for arranging pattern data in rows and columns.

When an optical fiber is processed by the fabrication process of the invention, ripples can be much more reduced by forming a grating form of repetitive groove-and-strip pattern by multiple exposure.

Figure 4:
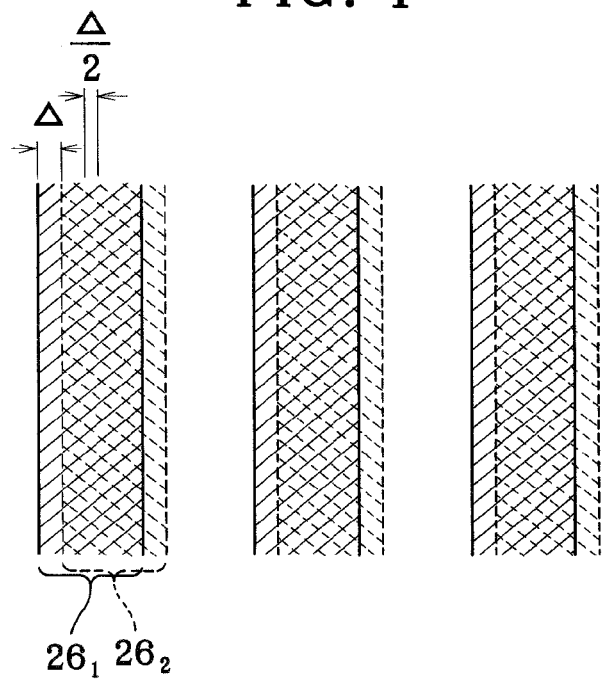
FIG. 4 is a schematic of how to carry out multiple writing while a writing area is displaced.

Multiple exposure may be carried out by multiple writing at the same place or arbitrarily displacing a writing area as shown in FIG. 4. In FIG. 4, reference numeral $26_1$ represents a portion of one of adjacent segments wherein a groove is written and exposed to light (a solid line), and $26_2$ stands for a portion of the other wherein a groove is written and exposed to light (a broken line). Here let Δ be indicative of a displacement that occurs between adjacent segments. At this overlapping area A, one groove is defined by an overlap of the exposed areas $26_1$ and $26_2$, with the center being displaced by Δ/2 from the center of a groove having no overlap. In other words, that displacement is half that between writing areas; so stitching errors are reduced to half. When three or more overlapping operations are carried out, the number of stitching errors is equal to the number of such operations.

While a raster scan type electron beam lithography device is used as the electron beam lithography device in the aforesaid fabrication process of the invention, it is understood that other writing devices inclusive of a vector scan type writing device may be used.

It is also acceptable to use a laser light lithography device in place of the electron beam lithography device.

How to prepare a grating using a phase mask fabricated as described above is shown in FIG. 5.

Figure 5:
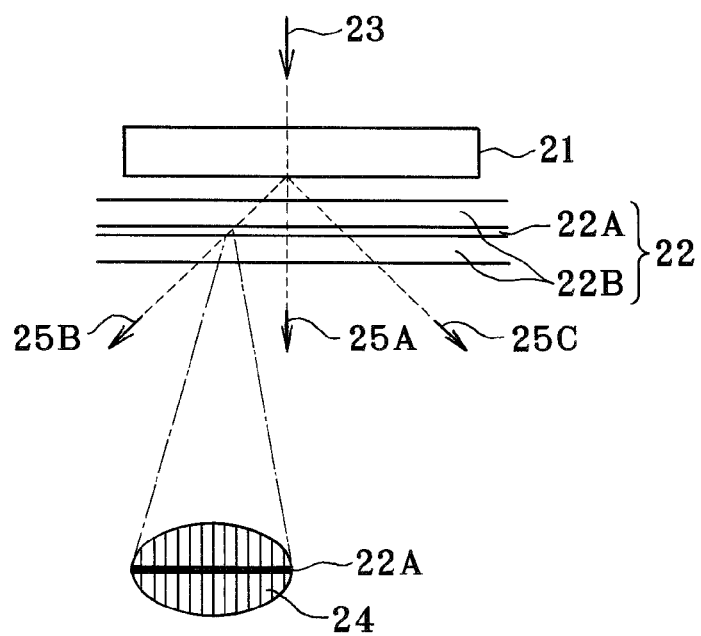
FIG. 5 is illustrative of how to process an optical fiber.

As shown in FIG. 5, one surface of a quartz substrate is irradiated with ultraviolet laser light, e.g., KrF excimer laser light of 248 nm wavelength via a phase mask 21 fabricated by the fabrication process of the invention to form a grating in a core 22A of an optical fiber 22 comprising a core 22A and a clad 22B, thereby preparing an optical fiber with a Bragg grating.

As already explained, the depth D (a difference in height between the strip 27 and the groove 26) of the groove 26 in the phase mask 21 fabricated by the fabrication process of the invention is selected such that the phase of excimer laser light 23 that is exposure light is modulated by $\pi$ radian. As shown in FIG. 5, light 25A of zero order is reduced by the phase mask 21 down to 5% or lower, and chief light leaving the phase mask 21 is split into diffracted light 25B of plus first order, including 35% or more of diffracted light, and diffracted light 25C of minus first order. By irradiation with interference fringes at a given pitch, which comprise the diffracted light 25B of plus first order and the diffracted light 25C of minus first order, it is thus possible to bring a refractive index change at that pitch in the optical fiber 22.

The thus obtained Bragg grating of the invention has group delay ripple characteristics of preferably ±10 ps or lower, and more preferably ±3 ps or lower.

The Bragg grating fabricated by the fabrication process of the invention may be used to form a dispersion compensating module.

The dispersion compensating module may be constructed by connecting a chirped Bragg grating to the second port of, for instance, a three-port type optical circulator. Input light is entered into the first port and output light leaves the third port. By imparting a temperature gradient to the chirped Bragg grating, the chirp rate (dispersion) may be controlled.

A dispersion compensating device formed with a Bragg grating using the phase mask fabricated by the fabrication process of the invention is reduced in terms of group delay ripple and improved in terms of dispersion compensating function.

According to the invention as detailed above, writing data obtained by arranging and compiling a plurality of data for a repetitive groove-and-strip pattern while the pitch of repetition is modulated are used and an electron beam resist is provided on a phase mask blank, so that writing is carried out all over the writing area on said phase mask blank continuously in the direction vertical to the grating form of grooves, so that stitching errors on writing can be reduced to improve the group delay characteristics of a replicated Bragg grating.

The phase mask of the invention has also the feature of being reduced in terms of stitching errors on writing.

The optical fiber with a Bragg grating of the invention has improved group delay characteristics. Owing to reduced stitching errors, there are no unnecessary peaks on both sides of a Bragg peak.

The dispersion compensating device of the invention has a reduced group delay ripple amplitude and an improved dispersion compensation function.

What we claim is:

1. A process for the fabrication of a chirped type optical fiber-processing phase mask wherein a grating form of grooves provided in one surface of a quartz substrate is configured as an optical fiber-processing grating pattern, characterized in that:

at an exposure step, writing data obtained by arranging and compiling a plurality of data for a repetitive groove-and-strip pattern while the pitch of repetition is modulated are used and an electron beam resist is provided on a phase mask blank, so that writing is carried out all over the writing area on said phase mask blank continuously in a vertical direction to said grating form of grooves, with the modulated pitch data governing the distance between centers of scanning lines employed in performing the exposure step.

2. The process for the fabrication of an optical fiber-processing phase mask according to claim 1, characterized in that said grating form of repetitive groove-and-strip pattern is formed by multiple exposure.

3. The process for the fabrication of an optical fiber-processing phase mask according to claim 2, characterized in that said multiple exposure is carried out by multiple writing at the same place.

4. The process for the fabrication of an optical fiber-processing phase mask according to claim 2, characterized in that said multiple exposure is carried out by multiple writing at an arbitrarily displaced writing area.

5. The process for the fabrication of an optical fiber-processing phase mask according to claim 1, characterized in that writing is carried out by means of an electron beam lithography device.

6. The process for the fabrication of an optical fiber-processing phase mask according to claim 1, characterized in that writing is carried out by means of a laser light lithography device.

7. The process for the fabrication of an optical fiber-processing phase mask according to claim 1, characterized in that said grating form of repetitive groove-and-strip pattern has a pitch in the range of 0.85 μm to 1.25 μm.

8. The process for the fabrication of an optical fiber-processing phase mask according to claim 1, characterized in that a difference between a groove and a strip in said grating form of repetitive groove-and-strip pattern is of such magnitude that the phase of optical fiber-processing ultraviolet is shifted by about $\pi$ upon transmission.

9. The process for the fabrication of an optical fiber-processing phase mask according to claim 1, wherein a constant number of scan lines are employed between a first and second pitch of repetition.

10. A chirped type optical fiber-processing phase mask wherein a grating form of grooves provided in one surface of a quartz substrate is configured as an optical fiber-processing grating pattern, characterized in that:

said phase mask is obtained by a fabrication process wherein at an exposure step, writing data obtained by arranging and compiling a plurality of data for a repetitive groove-and-strip pattern while the pitch of repetition is modulated are used and an electron beam resist is provided on a phase mask blank, so that writing is carried out all over the writing area on said phase mask blank continuously in a vertical direction to said grating form of grooves, with the modulated pitch data governing the distance between centers of scanning line employed in performing the exposure step.

11. The optical fiber-processing phase mask according to claim 10, characterized in that said grating form of repetitive groove-and-strip pattern is formed by multiple exposure.

12. The optical fiber-processing phase mask according to claim 11, characterized in that said multiple exposure is carried out by multiple writing at the same place.

13. The optical fiber-processing phase mask according to claim 11, characterized in that said multiple exposure is carried out by multiple writing at an arbitrarily displaced writing area.

14. The optical fiber-processing phase mask according to claim 10, characterized in that writing is carried out by means of an electron beam lithography device.

15. The optical fiber-processing phase mask according to claim 10, characterized in that writing is carried out by means of a laser light lithography device.

16. The optical fiber-processing phase mask according to claim 10, characterized in that said grating form of repetitive groove-and-strip pattern has a pitch in the range of 0.85 μm to 1.25 μm.

17. The optical fiber-processing phase mask according to claim 10, characterized in that a difference between a groove and a strip in said grating form of repetitive groove-and-strip pattern is of such magnitude that the phase of optical fiber-processing ultraviolet is shifted by about $\pi$ upon transmission.

18. The optical fiber-processing phase mask according to claim 10, wherein a constant number of scan lines are employed between a first and second pitch of repetition.

* * * * *